(12) United States Patent
Wu et al.

(10) Patent No.: US 9,209,268 B2
(45) Date of Patent: Dec. 8, 2015

(54) SEMICONDUCTOR DEVICE AND METHOD OF MAKING

(71) Applicant: Fudan University, Shanghai (CN)

(72) Inventors: Dongping Wu, Shanghai (CN); Chenyu Wen, Shanghai (CN); Wei Zhang, Shanghai (CN); Shi-Li Zhang, Stockholm (SE)

(73) Assignee: FUDAN UNIVERSITY, Shanghai (CN)

( * ) Notice: Subject to any disclaimer, the term of this patent is extended or adjusted under 35 U.S.C. 154(b) by 0 days.

(21) Appl. No.: 13/704,615

(22) PCT Filed: Dec. 14, 2012

(86) PCT No.: PCT/CN2012/086659
§ 371 (c)(1),
(2) Date: Dec. 15, 2012

(87) PCT Pub. No.: WO2014/089825
PCT Pub. Date: Jun. 19, 2014

(65) Prior Publication Data
US 2014/0315366 A1   Oct. 23, 2014

(51) Int. Cl.
*H01L 21/4763* (2006.01)
*H01L 29/66* (2006.01)
*H01L 21/283* (2006.01)
*H01L 21/768* (2006.01)
*H01L 23/485* (2006.01)
*H01L 23/532* (2006.01)
*H01L 21/285* (2006.01)

(52) U.S. Cl.
CPC ............ *H01L 29/665* (2013.01); *H01L 21/283* (2013.01); *H01L 21/28518* (2013.01); *H01L 21/28525* (2013.01); *H01L 21/76802* (2013.01); *H01L 21/76843* (2013.01); *H01L 21/76855* (2013.01); *H01L 21/76877* (2013.01); *H01L 21/76889* (2013.01); *H01L 23/485* (2013.01); *H01L 23/53271* (2013.01); *H01L 2924/0002* (2013.01)

(58) Field of Classification Search
CPC .................. H01L 21/76889; H01L 21/28518; H01L 29/458; H01L 29/665
USPC .......................... 438/618, 629, 630, 655, 682
See application file for complete search history.

(56) References Cited

U.S. PATENT DOCUMENTS 4,109,372 A * 8/1978 Geffken ......................... 438/308
8,603,881 B1 * 12/2013 Alptekin et al. .............. 438/300

(Continued)

*Primary Examiner* — Karen Kusumakar
(74) *Attorney, Agent, or Firm* — Jamie J. Zheng, Esq.

(57) ABSTRACT

The present disclosure is related to semiconductor technologies and discloses a semiconductor device and its method of making. In the present disclosure, a transistor's source and drain are led out by concurrently formed metal-semiconductor compound contact regions at the source and drain and metal-semiconductor compounds in vias formed at positions corresponding to the source and drain. Because the metal-semiconductor compound has relatively low resistivity, the resistance of the metal-semiconductor compounds in the vias can be minimized. Also, because the material used to fill the vias and the material forming the source/drain contact regions are both metal-semiconductor compound, contact resistance between the material filling the vias and the metal-semiconductor compound source/drain contact regions can be minimized. Furthermore, because the material filling the vias is metal-semiconductor compound, the conducting material in the vias and dielectric material in the insulator layer can form good interface and have good adhesion properties, and the conducting material would not cause structural damage in the dielectric material. Thus, there is no need to form a barrier layer between the insulator layer and the material filling the vias.

5 Claims, 11 Drawing Sheets

(56) References Cited

U.S. PATENT DOCUMENTS

| | | | |
|---|---|---|---|
| 2001/0023124 A1* | 9/2001 | Bartsch et al. | 438/597 |
| 2003/0124841 A1* | 7/2003 | Kweon | 438/653 |
| 2007/0152338 A1* | 7/2007 | Kim | 257/758 |
| 2009/0090939 A1* | 4/2009 | Doris et al. | 257/288 |

* cited by examiner

SEMICONDUCTOR DEVICE AND METHOD OF MAKING

FIELD

The present disclosure is related to semiconductor technologies, and more particularly to a semiconductor device and its method of making.

DESCRIPTION OF RELATED ART

As the semiconductor industry develop towards smaller and faster devices, the lateral feature size (e.g., gate length) and feature depth (e.g., source/drain junction depth) of semiconductor devices become gradually smaller, and operation speed of the devices become faster and faster. To suppress short-channel effect, the source/drain and source/drain extension regions are required to become shallower. The source/drain junction depth of semiconductor devices is required to be less than 30 nm according to current processing technologies. Ultra-shallow junctions for future technology node can become less than 15 nm.

In back-end of line (BEOL) processing of semiconductor devices, source and drain need to be led out by filling vias or contact holes with metal (e.g., tungsten), so that metal interconnect can be formed subsequently to connect individual devices. As known in this field, the vias act as electrical pathways between the BOEL metal layers (e.g., copper) and source/drain and gate electrodes of the devices, and are typically formed by etching holes or trenches in a dielectric layer and filling the holes or trenches with metal. As semiconductor device sizes become smaller and smaller, the vias also become smaller and smaller, and for the metal in the vias, the ratio of the length along the direction of current flow to cross-sectional area perpendicular to the direction of current flow can become larger, resulting in the resistance of the metal filling the vias to become larger. Furthermore, this conducting material in the vias and the silicon dioxide in the dielectric layer are required to have a good interface and good adhesion properties, and the conducting material should not cause structural damage of the dielectric material. Moreover, contact resistance between the metal in the vias and metal silicide source/drain contacts can become larger. Because the resistance of the metal in the vias and the contact resistance can become larger, device operating efficiency can be affected. Also, as the vias become smaller and smaller, their aspect ratios become larger, making it more and more difficult to fill them with metal, and more challenging to maintain metal filling consistency.

In order to minimize the resistance of the metal in the vias and the contact resistance, and to insure metal filling consistency among vias of different aspect ratios, low resistivity metal materials such as tungsten is usually selected for via filling. Tungsten, however, can damage silicon dioxide or silicides when contacting the silicon dioxide dielectric layer or silicide source/drain contacts, and can even react with the silicon under the silicides. Thus, a barrier layer (e.g., titanium nitride TiN) is considered to be placed between tungsten and silicon dioxide or silicides. Such a barrier layer, however, would have higher resistance than tungsten. Furthermore, the addition of the barrier layer can cause the tungsten in the vias to be come even smaller, and the resistance of the metal in the vias to be even larger, thereby further increasing the resistance of the vias.

SUMMARY

The present disclosure purports to provide a semiconductor device and its method of making, to minimize resistance of a material filling vias formed at the source and drain and contact resistance between the via-filling material and source/drain contact regions.

To solve the above technological problems, embodiments of the present disclosure provide a method of making a semiconductor device, comprising:

A. forming at least one transistor on a semiconductor substrate, each transistor having a source and a drain;

B. forming an insulator layer covering the at least one transistor prior to forming any metal-semiconductor compound contract regions at the source and drain of each transistor;

C. etching the insulator layer to form vias at the source and drain of each transistor; and D. forming metal-silicide contact regions at the source and drain of each transistor concurrently with forming metal-semiconductor compounds in the vias to leas out the source and drain.

Embodiments of the present disclosure further provide a semiconductor device, comprising: at least one transistor and an insulator layer over the transistor;

wherein, vias are formed in the insulator layer at the source and drain, and metal-semiconductor compounds including metal silicides are formed in the vias.

wherein the semiconductor device further comprises source/drain metal-semiconductor compound contacts formed concurrently with the metal-semiconductor compounds in the vias.

The metal-semiconductor compounds in the vias are used to lead out the source and drain of the transistor via the source/drain metal-semiconductor compound contacts.

Compared with conventional technologies, embodiments of the present disclosure lead out a transistor's source and drain by concurrently forming metal-semiconductor compound contact regions at the source and drain and metal-semiconductor compounds in vias formed at positions corresponding to the source and drain. Because the metal-semiconductor compound has relatively low resistivity, the resistance of the metal-semiconductor compounds in the vias can be minimized. Also, because the material used to fill the vias and the material forming the source/drain contact regions are both metal-semiconductor compounds, contact resistance between the material filling the vias and the metal-semiconductor compound source/drain contact regions can be minimized. Furthermore, because the material filling the vias is metal-semiconductor compound, the conducting material in the vias and dielectric material in the insulator layer can form good interface and have good adhesion properties, and the conducting material would not cause structural damage in the dielectric material. Thus, there is no need to form a barrier layer between the insulator layer and the material filling the vias.

Additionally, the following method can be used to concurrently form metal-semiconductor compound contact regions at the source and drain and metal-semiconductor compounds in the vias:

D1-1. depositing a layer of silicon, silicon germanium (SiGe), or silicon and silicon germanium (Si/SiGe) stacked structure in the vias;

D1-2. depositing a layer of metal over the layer of silicon, silicon germanium (SiGe), or silicon and silicon germanium (Si/SiGe) stacked structure;

D1-3. placing the transistor with the metal layer deposited thereon in a microwave heating chamber and performing annealing to obtain metal-semiconductor compounds, wherein multi-mode and multi-frequency microwaves are employed in the microwave heating chamber during annealing; and D1-4. removing any metal layer and metal-semiconductor compound outside of the vias by chemical mechanical polishing (CMP), while retaining the metal semiconductor compounds formed at the source and drain of the transistors and in the vias.

By using the above method to form metal-semiconductor compounds at the source, drain and in the vias, processing is simply and easy to implement, resulting in reduced production costs.

Alternatively, the following method can be used to form metal-semiconductor compound contact regions at the source and drain and metal-semiconductor compounds in the vias:

D2-1. depositing a thin film of metal on internal walls of the vias;

D2-2. depositing a layer of silicon, silicon germanium (SiGe), or silicon and silicon germanium (Si/SiGe) stacked structure on the thin film of metal;

D2-3. placing the transistor with the metal layer deposited thereon in a microwave heating chamber and performing annealing to obtain metal-semiconductor compound, wherein multi-mode and multi-frequency microwaves are employed in the microwave heating chamber during annealing; and D2-4. removing any metal layer and metal-semiconductor compound outside of the vias by chemical mechanical polishing (CMP), while retaining metal-semiconductor compounds formed in the vias and at the source and drain of the transistor.

Alternatively, the following method can be used to form the metal-semiconductor compound contact regions at the source and drain of the transistor while at the same time forming the metal-semiconductor compounds in the vias:

D3-1. depositing a thin film of metal on interval walls of the vias;

D3-2. depositing a layer of silicon, silicon germanium (SiGe), or silicon and silicon germanium (Si/SiGe) stacked structure on the thin film of metal;

D3-3. removing any metal, silicon, silicon germanium (SiGe), or silicon and silicon germanium (Si/SiGe) stacked structure outside of the vias by chemical mechanical polishing (CMP); and D3-4. placing the transistor after the CMP in a microwave heating chamber and performing annealing to form the metal-semiconductor compound contact regions at the source and drain of the transistor and the metal-semiconductor compounds in the vias.

By using any of the above method to form metal-semiconductor compound inside the vias, metal can uniformly diffuse into the silicon, silicon germanium (SiGe), or silicon and silicon germanium (Si/SiGe) stacked structure, so as to minimize the resistance of the metal-semiconductor compounds inside the vias and the contact resistance at the metal-semiconductor compound source/drain contact regions.

In a further embodiment, after the above D2-2 step and before the D2-3 step, a metal layer can be deposited on the silicon, silicon germanium (SiGe), or silicon and silicon germanium (Si/SiGe) stacked structure.

Or, after the D3-3 step and before the D3-4 step, the following step can be performed:

depositing a metal layer over the silicon, silicon germanium (SiGe), or silicon and silicon germanium (Si/SiGe) stacked structure.

After the D3-4 step, the following step can be performed:

removing the metal layer outside of the vias by CMP, while retaining metal-semiconductor compounds formed at the source and drain of the transistor and in the vias.

By forming metal-semiconductor compound in the vias using the above method, metal can diffuse toward the silicon, silicon germanium (SiGe), or silicon and silicon germanium (Si/SiGe) stacked structure from different directions, causing metal to diffuse further into the silicon and silicides, resulting in the metal-semiconductor compound inside the vias to be more uniform, minimizing the resistance of the metal-semiconductor compound inside the vias and the contact resistance at the metal-semiconductor compound source/drain contact regions.

In a further embodiment, Step D2-1 comprises:

depositing a first metal film on via bottoms and via walls to form a first metal thin film;

Removing portions of the first metal thin film deposited on via walls by wet etching;

depositing a second metal layer on walls of the vias;

wherein metal in the first metal layer and metal in the second metal layer can be of a same kind of different kinds.

This is to say, the metal-semiconductor compounds at the source and drain of the transistor and the metal-semiconductor compound inside the vias can be the same kind or different kinds Thus, metal from an enlarged selection can be used to form conductor inside the vias, and different metals can be selected to form the metal-semiconductor compound based on different practical requirements, to minimize resistance of metal-semiconductor compound inside the vias and contact resistance between the metal-semiconductor compound inside the vias and the metal silicide at the source and drain, allowing more flexible applications.

DETAILED DESCRIPTION OF THE EMBODIMENTS

Various embodiments of the present disclosure are explained in detail with reference to the drawings. Those of ordinary skill in the art should understand, however, that many technical details are set forward in the various embodiments in order for the readers to better understand the present application. The technology schemes claimed to be protected by the appended claims, however, can be implemented without such technical details, by making proper modifications and changes to the various embodiments.

Figure 1:
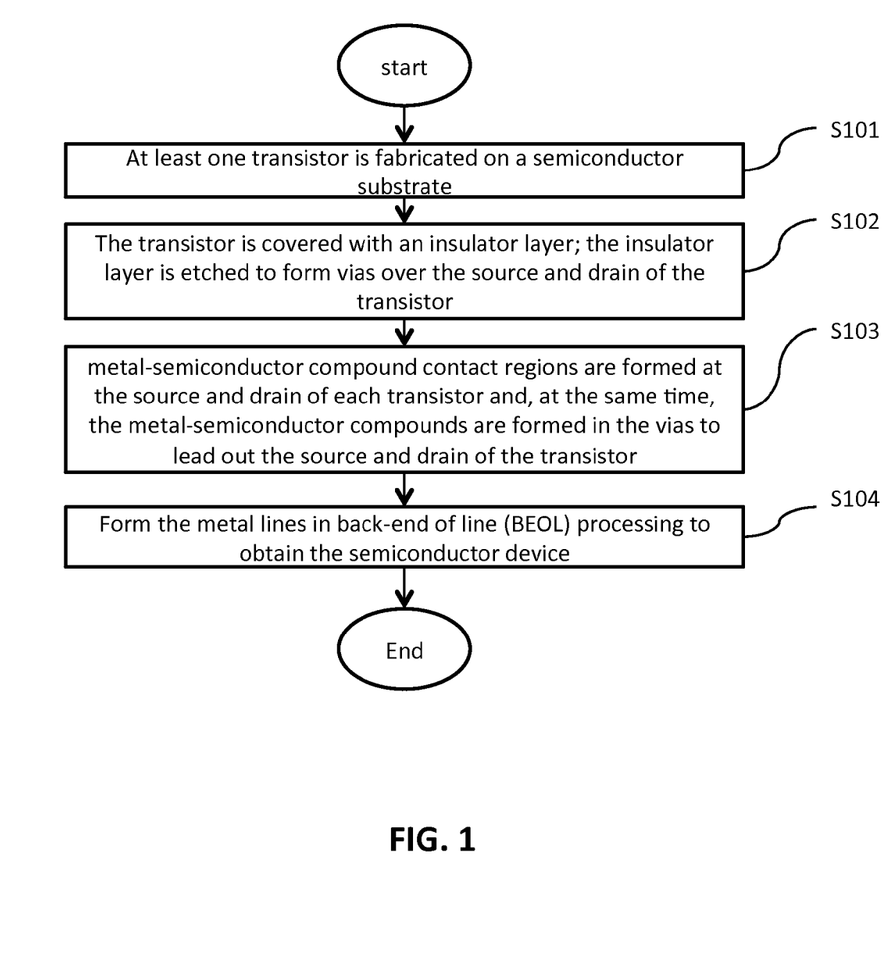
FIG. 1 is flowchart illustrating a method of making a semiconductor device according to one embodiment of the present disclosure.

According to one embodiment of the present disclosure, as shown in the flowchart in FIG. 1, a method 100 of making a semiconductor device comprises the following specific steps.

In step S101, at least one transistor is fabricated on a semiconductor substrate using conventional means.

In Step S102, the transistor is covered with an insulator layer; the insulator layer is etched to form vias over the source and drain of the transistor.

In steps S101 to S102, conventional semiconductor device fabrication processes such as deposition, etching, ion implantation and annealing can be used to fabricate the transistor, its source/drain contact regions, the insulator layer and vias, which do not need to be discussed in detail.

Figure 3A:
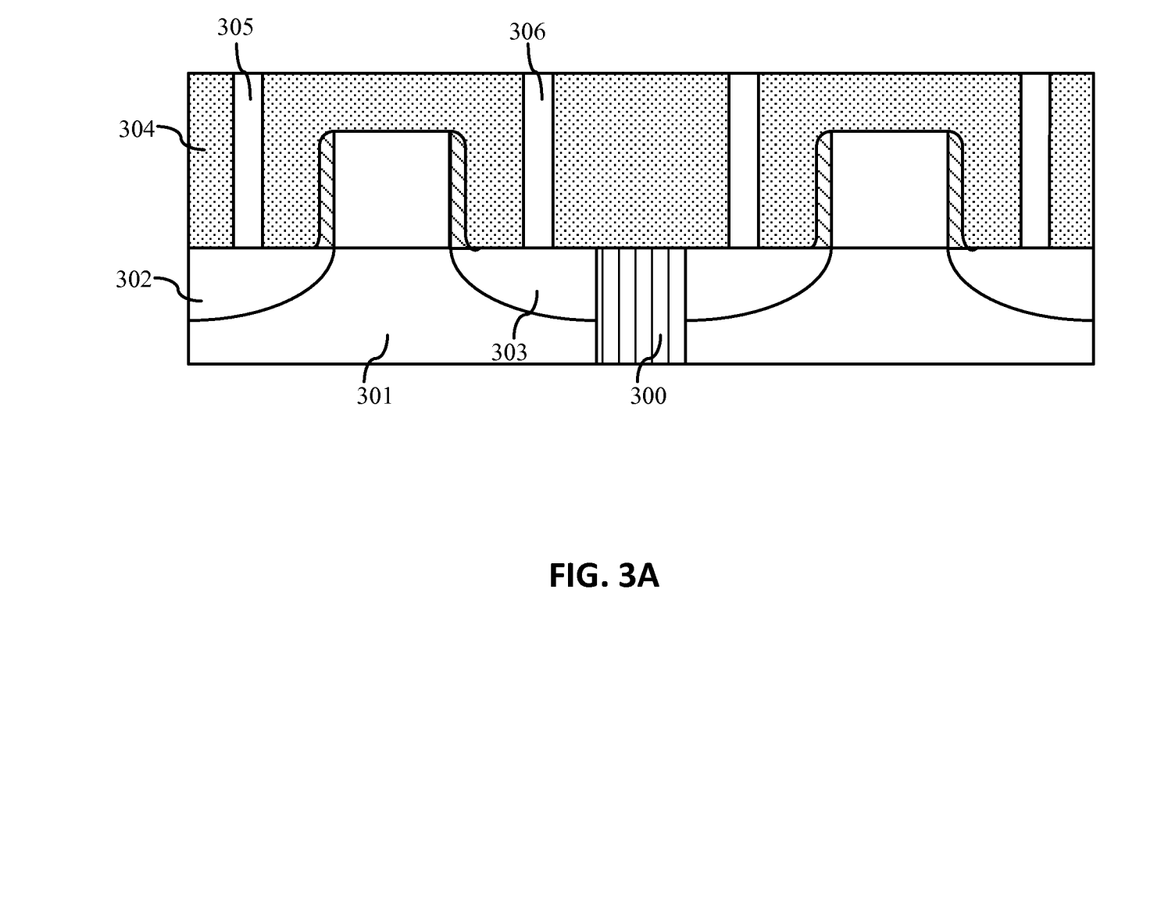
FIGS. 3A to 3E are structural cross-sectional diagrams corresponding to various steps of forming metal-semiconductor compound in vias according to one embodiment of the present disclosure.

After step S102, a structure shown in FIG. 3A can be obtained. As shown in FIG. 3A, shallow trench isolation (STI) is formed in the substrate 301 between two transistors, the transistors each having a source 302, a drain 303, an insulator layer 304, via 305 corresponding to the source and via 306 corresponding to the drain.

In step S103, metal-semiconductor compound contact regions are formed at the source and drain of each transistor and, at the same time, the metal-semiconductor compounds are formed in the vias to lead out the source and drain of the transistor.

Figure 2:
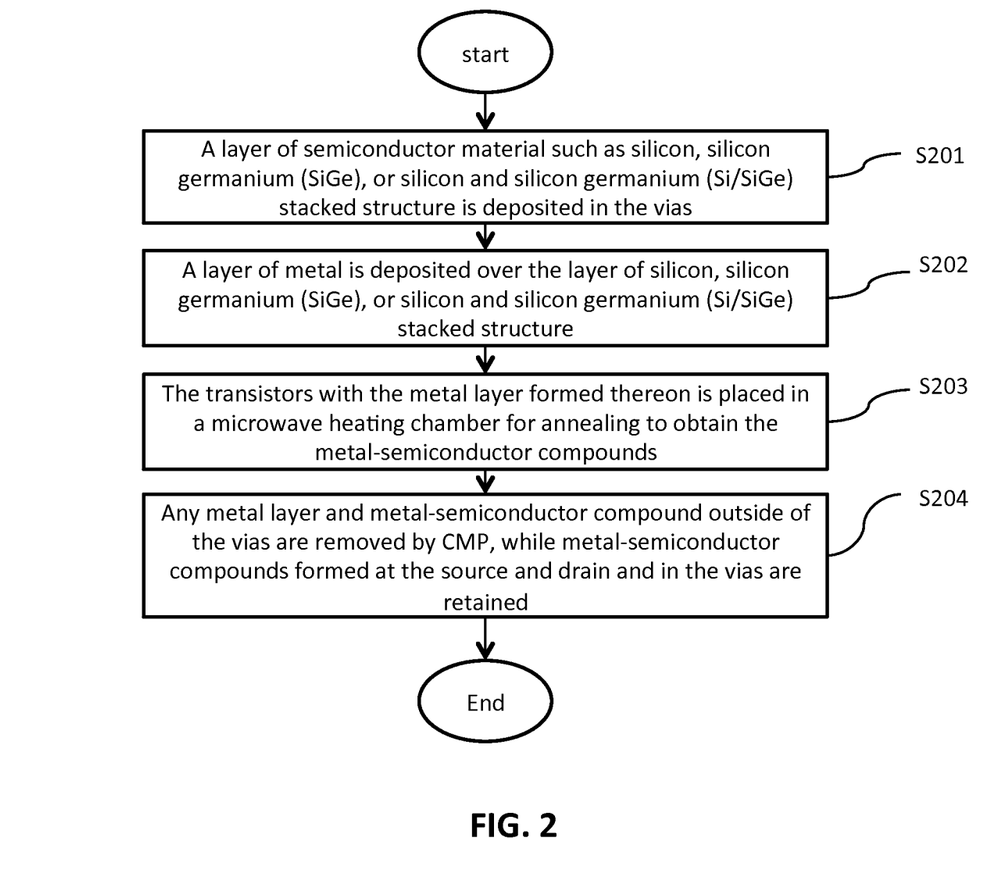
FIG. 2 is a flowchart illustrating a method of forming metal-semiconductor compound in vias according to one embodiment of the present disclosure.

FIG. 2 is a flowchart illustrating a method 200 of currently forming metal-semiconductor compound contact regions at the source and drain of the transistor and the metal-semiconductor compounds in the vias, according to one embodiment. FIGS. 3A to 3E are structural cross-sectional diagrams corresponding to the various steps of the method 200. The method 200 of concurrently forming metal-semiconductor compound contact regions at the source and drain of the transistor and the metal-semiconductor compounds in the vias according to one embodiment is specifically discussed below with reference to FIG. 2, and FIGS. 3A to 3E.

In step S201, a layer of semiconductor material such as silicon, silicon germanium (SiGe), or silicon and silicon germanium (Si/SiGe) stacked structure is deposited in the vias.

Figure 3B:
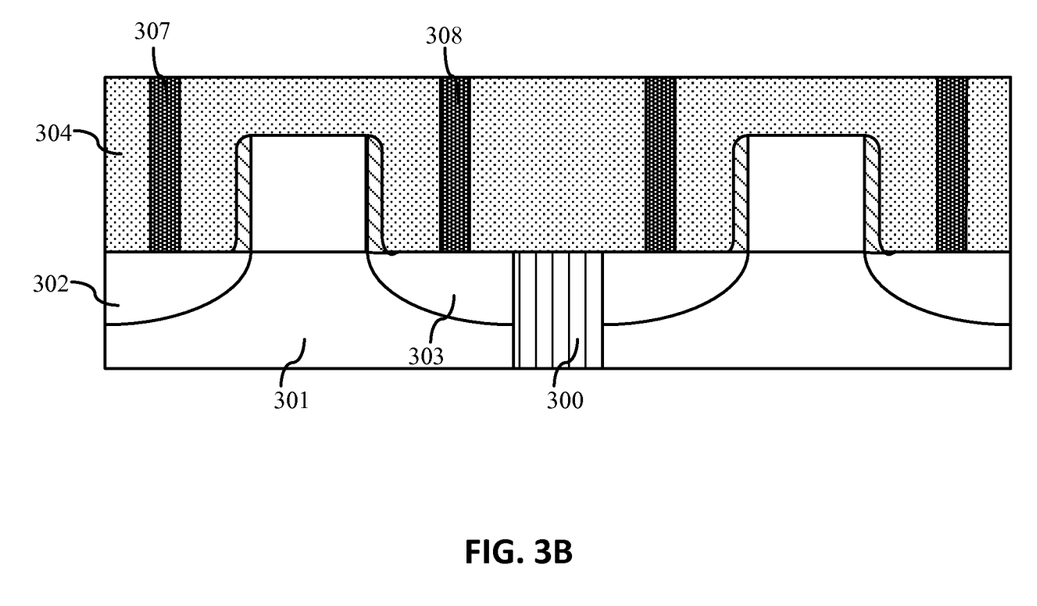

In this step, a layer of silicon, silicon germanium (SiGe), or silicon and silicon germanium (Si/SiGe) stacked structure 307 and 308 is deposited in the vias (e.g., vias 305 and 306), as shown in FIG. 3B. One or more deposition processes, such as one or more plasma enhanced chemical vapor deposition (PECVD) processes, physical vapor deposition (PVD) processes, atomic layer deposition (ALD) processes, etc., can be used in this step. In one embodiment, the silicon can be amorphous silicon or polysilicon.

Figure 3C:
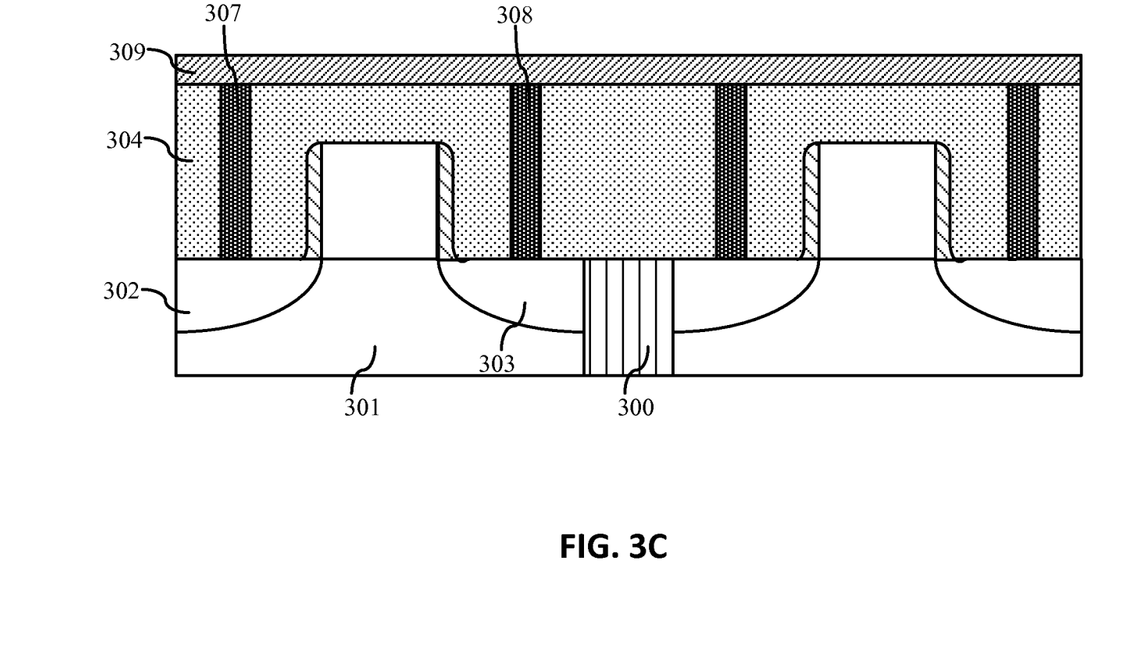

In step S202, a layer of metal 309 is deposited over the layer of silicon, silicon germanium (SiGe), or silicon and silicon germanium (Si/SiGe) stacked structure, as shown in FIG. 3C. In one embodiment, physical vapor deposition (PVD) can be used to fabricate the layer of metal. Although the metal can be any of nickel, cobalt, titanium, platinum, tungsten, or a combination of two or more thereof, nickel or nickel mixed with platinum or tungsten is more preferred.

Figure 3D:
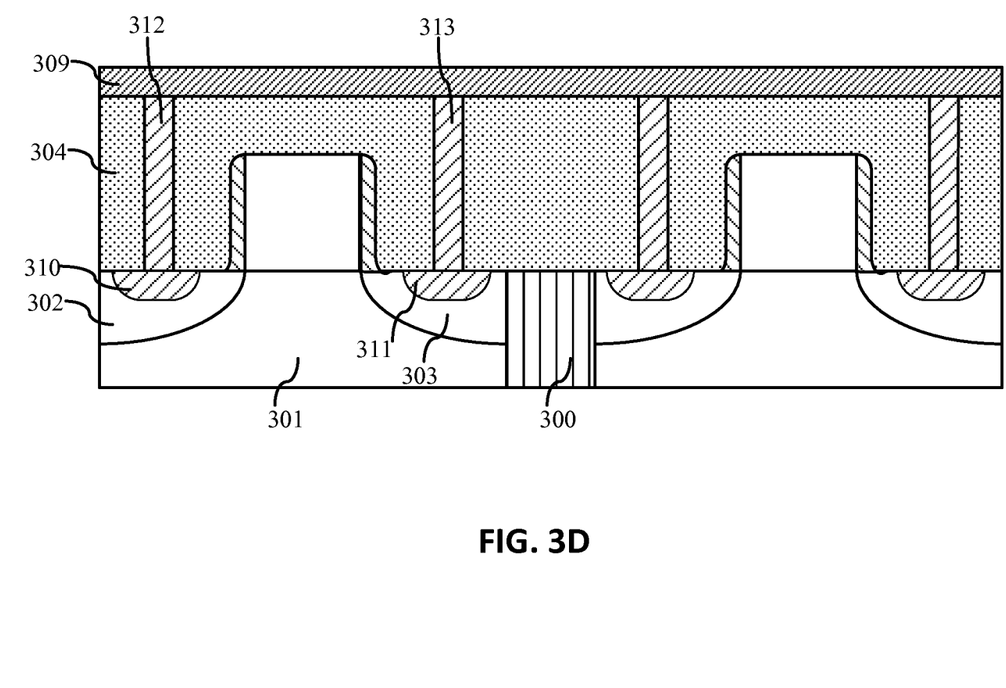

In step S203, the transistors with the metal layer formed thereon is placed in a microwave heating chamber for annealing to obtain the metal-semiconductor compounds, including the metal-semiconductor compounds 310 at the source, the metal-semiconductor compounds at the drain 311, and metal-semiconductor compounds 312 and 313 in the vias, as shown in FIG. 3D.

In one embodiment, by using microwave annealing, metal diffusion into silicon, silicon germanium (SiGe), or silicon and silicon germanium (Si/SiGe) stacked structure can be realized under relatively low temperature, so that any effect of annealing on high-K dielectric/metal gate electrode can be reduced. Furthermore, multi-mode and multi-frequency electromagnetic waves can be employed in the microwave heating chamber during the annealing. In one embodiment, the frequencies of the microwaves are between 1.5 GHz and 20 GHz, and the duration of microwave heating is about 1 minute to about 30 minutes.

In one embodiment, the substrate with the transistors and other layers formed thereon are placed in a microwave chamber of microwave annealing equipment, and gas pressure, gas types and densities, microwave frequencies and modes, etc., in the microwave chamber can be controlled according to the properties of the metal being annealed. For example, the microwave annealing equipment Axom150/Axom300 by DSG Technologies can be used. During annealing, with the substrate to be annealed placed in the microwave chamber of the microwave annealing equipment, control can be as simple as turning on and turning off the equipment after inputting a set of control parameters via the equipment's user interface. Note that when using the Axom150/Axom300 microwave annealing equipment for microwave annealing, the radio frequency electromagnetic waves should display a Gaussian distribution near 5.8 GHz, multiple frequencies with intervals of 30 Hz-50 Hz should be used for the annealing, and the microwaves having these frequencies should have multi-mode characteristics, so as to insure uniform and consistent distributions of microwave energies in the chamber, leading to uniform and consistent annealing for the transistors.

Figure 3E:
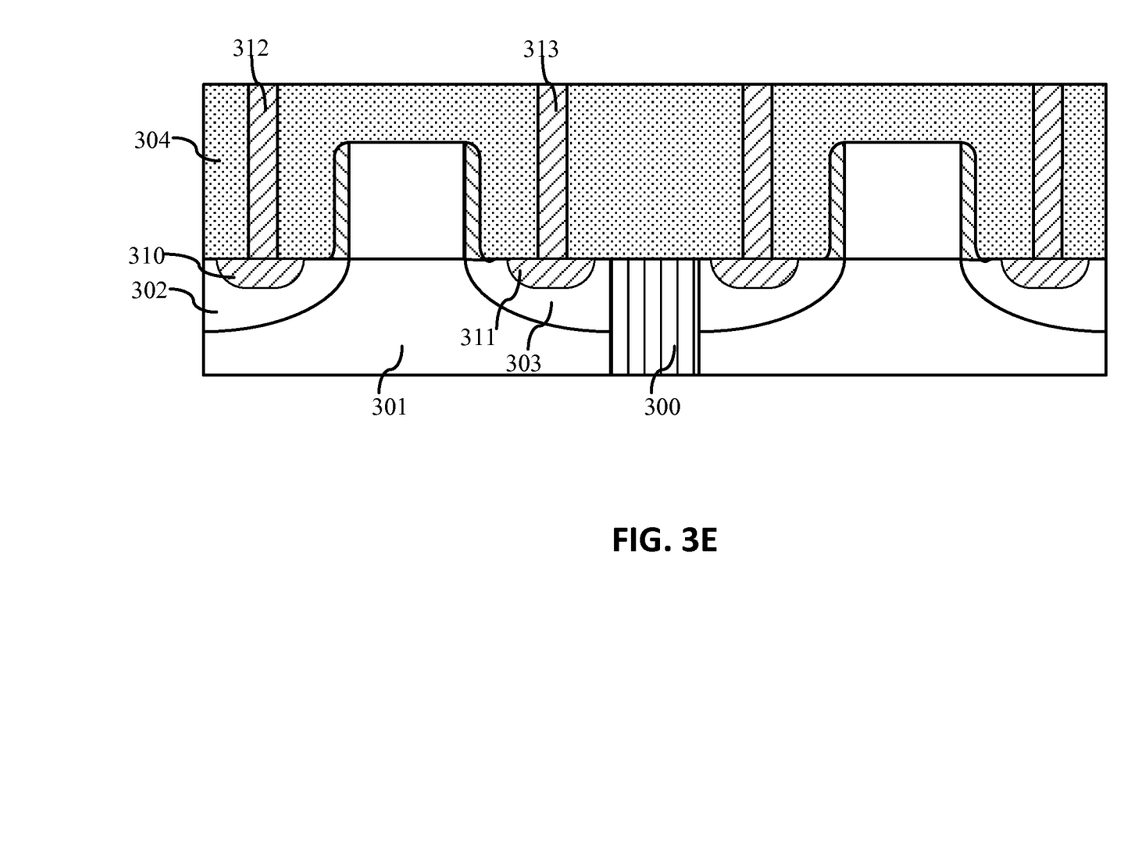

In step S204, any metal layer and metal-semiconductor compound outside of the vias, as indicated by reference numeral 309 in FIG. 3D, are removed by chemical mechanical polishing (CMP), while metal-semiconductor compounds 310, 311, 312 and 313 formed at the source and drain and in the vias are retained, as shown in FIG. 3E.

Additionally, after step S201 and before step S202, CMP can be performed to remove any silicon, silicon germanium (SiGe), or silicon and silicon germanium (Si/SiGe) stacked structure outside of the vias, retaining only the silicon, silicon germanium (SiGe), or silicon and silicon germanium (Si/SiGe) stacked structure inside the vias.

After forming the metal-semiconductor compounds at the source and drain and inside the vias in step S103, step S104 can be performed to form the metal lines in back-end of line (BEOL) processing to obtain the semiconductor device.

In one embodiment, the insulator material can be a low dielectric constant material, such as the commonly used silicon dioxide $SiO_2$, so that the metal-semiconductor compounds in the vias and $SiO_2$ can have good interface and good adhesion properties, and $SiO_2$ structure would not be damaged. Thus, there is no need to choose a special material for the metal-semiconductor compounds in the vias.

Compared with conventional technologies, embodiments of the present disclosure lead out a transistor's source and drain by concurrently forming metal-semiconductor compound contact regions at the source and drain and metal-semiconductor compounds in vias formed at positions corresponding to the source and drain. Because the metal-semiconductor compound has relatively low resistivity, the resistance of the metal-semiconductor compounds in the vias can be minimized. Also, because the material used to fill the vias and the material forming the source/drain contact regions are both metal-semiconductor compounds, contact resistance between the material filling the vias and the metal-semiconductor compound source/drain contact regions can be minimized. Furthermore, because the material filling the vias is metal-semiconductor compound, the conducting material in the vias and dielectric material in the insulator layer can form good interface and have good adhesion properties, and the conducting material would not cause structural damage in the dielectric material. Thus, there is no need to form a barrier layer between the insulator layer and the material filling the vias.

In the above-described embodiments, a method of making a semiconductor device forms metal-semiconductor compounds at the source and drain and in the vias by depositing silicon, silicon germanium (SiGe), or silicon and silicon germanium (Si/SiGe) stacked structure in the vias and depositing a layer of metal over the silicon, silicon germanium (SiGe), or silicon and silicon germanium (Si/SiGe) stacked structure. Metal-semiconductor compounds, such as metal silicide, metal germanide, and or metal germano-silicide, are formed by allowing the metal to react with the silicon, silicon germanium (SiGe), or silicon and silicon germanium (Si/SiGe) stacked structure. In an alternative embodiment, metal-semiconductor compounds at the source and drain and in the vias are formed by first depositing a thin film of metal in the vias and then depositing silicon, silicon germanium (SiGe), or silicon and silicon germanium (Si/SiGe) stacked structure on the thin film of metal. The metal reacts with the silicon, silicon germanium (SiGe), or silicon and silicon germanium (Si/SiGe) stacked structure to form the metal-semiconductor compounds at the source and drain and in the vias.

In one embodiment, a transistor structure shown in FIG. 3A is obtained using conventional technologies before forming the metal-semiconductor compounds at the source and drain and inside the vias.

Figure 4A:
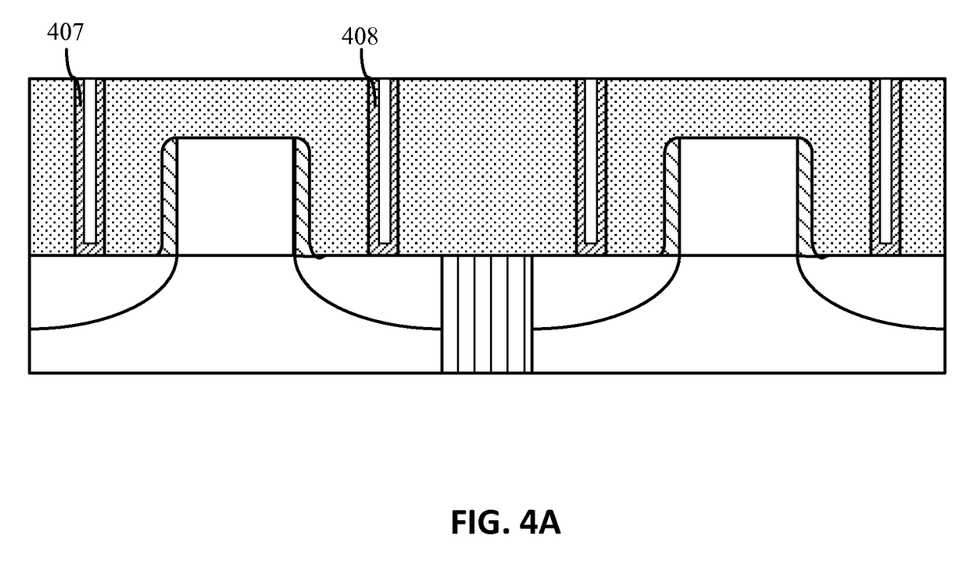
FIGS. 4A to 4C are structural cross-sectional diagrams corresponding to various steps of forming metal-semiconductor compound in vias according an alternative embodiment of the present disclosure.

First, metal thin film 407/408 is deposited in vias 305 and 306, as shown in FIG. 4A. In one embodiment, the metal film is formed by physical vapor deposition (PVD), using any of the metal selected from nickel, cobalt, titanium, platinum, tungsten, and a combination of two or more thereof.

Figure 4B:
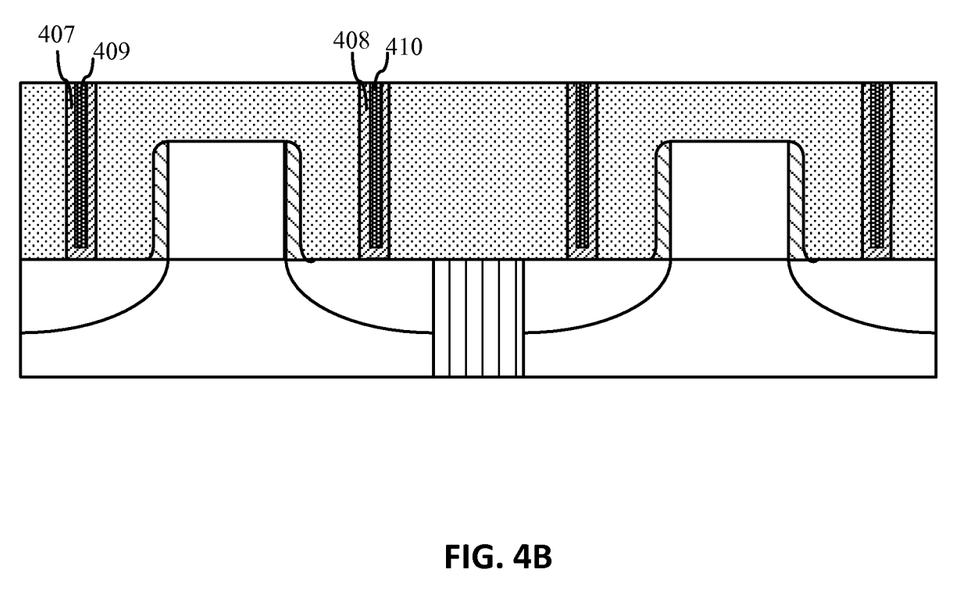

Subsequently, a layer of silicon, silicon germanium (SiGe), or silicon and silicon germanium (Si/SiGe) stacked structure 409/410 is deposited on the metal thin film 407/408, as shown in FIG. 4B. Common deposition processes, such as plasma enhanced chemical vapor deposition (PECVD), physical vapor deposition (PVD), atomic layer deposition (ALD) can be used. Here, silicon can be amorphous silicon or polysilicon.

Figure 4C:
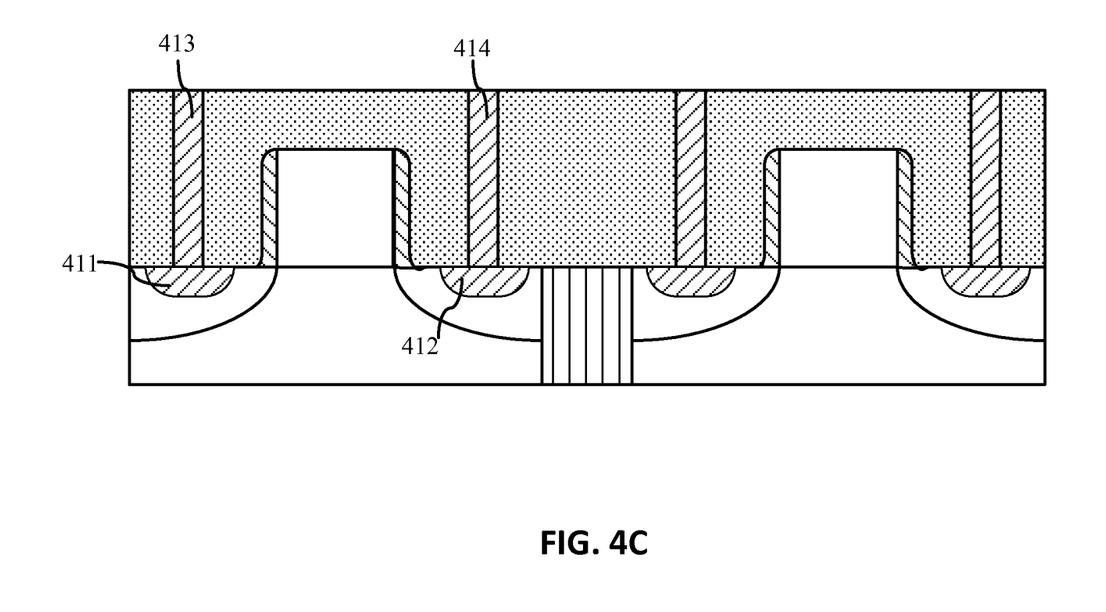

Afterwards, the transistor with the metal layer deposited thereon is placed in a microwave heating chamber and annealing is performed to obtain metal-semiconductor compounds 411, 412, and 413, as shown in FIG. 4C. Similar to previously discussed embodiments, multi-mode and multi-frequency microwaves are employed in the microwave heating chamber during annealing. The frequencies of the microwaves are between 1.5 GHz and 20 GHz, and the duration of microwave heating is about 1 second to about 30 seconds.

In some embodiments, metal-semiconductor compound can be formed outside the vias because metal and silicon, silicon germanium (SiGe), or silicon and silicon germanium (Si/SiGe) stacked structure are unavoidably deposited outside of the vias as well as inside the vias. CMP can be used to remove any metal or metal-semiconductor compound outside of the vias, retaining the metal-semiconductor compounds inside the vias. Or, CMP can be performed after depositing the metal film and the silicon, silicon germanium (SiGe), or silicon and silicon germanium (Si/SiGe) stacked structure and before microwave annealing remove any metal and silicon, silicon germanium (SiGe), or silicon and silicon germanium (Si/SiGe) stacked structure outside the vias.

In yet another embodiment of a method of making a semiconductor device, metal-semiconductor compounds in the vias are formed by making metal diffuse into the silicon, silicon germanium (SiGe), or silicon and silicon germanium (Si/SiGe) stacked structure from different directions toward via centers.

Figure 5:
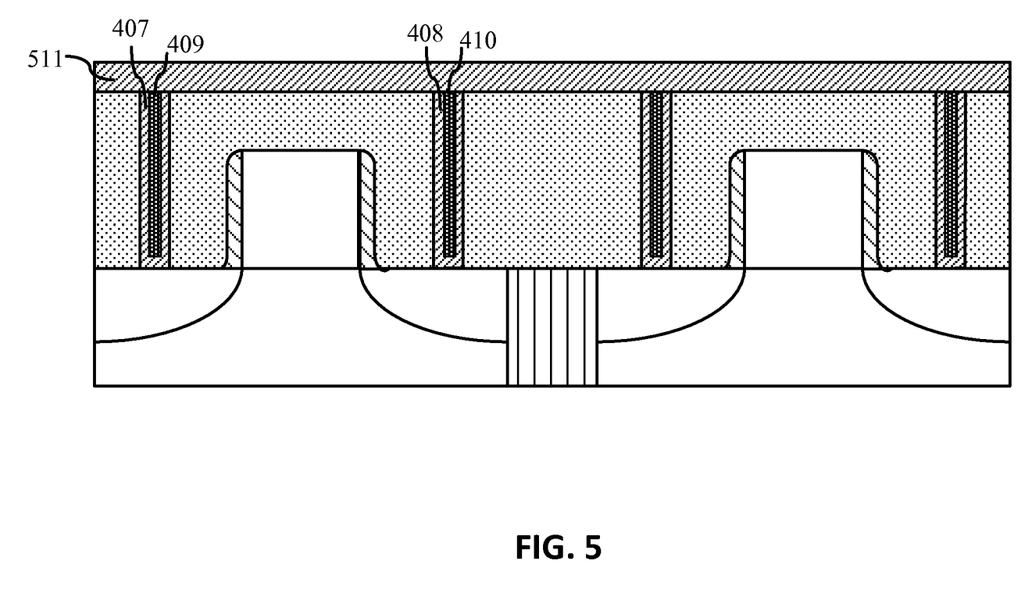
FIG. 5 is a structural cross-sectional diagram illustrating forming metal-semiconductor compound in vias according a yet another alternative embodiment of the present disclosure.

More specifically, after depositing silicon, silicon germanium (SiGe), or silicon and silicon germanium (Si/SiGe) stacked structure on the metal film and before obtaining metal-semiconductor compounds using microwave annealing, another layer of metal 511 is deposited on the silicon, silicon germanium (SiGe), or silicon and silicon germanium (Si/SiGe) stacked structure, as shown in FIG. 5. Microwave annealing is performed afterwards to obtain the metal-semiconductor compounds. CMP is performed thereafter to remove any metal layer and metal-semiconductor compound outside of the vias, retaining the metal-semiconductor compounds at the source and drain and inside the vias.

Or, CMP can be performed after depositing the metal film and silicon, silicon germanium (SiGe), or silicon and silicon germanium (Si/SiGe) stacked structure but before microwave annealing to remove any metal, silicon, silicon germanium (SiGe), or silicon and silicon germanium (Si/SiGe) stacked structure outside of the vias. The metal layer can then be deposited on the silicon, silicon germanium (SiGe), or silicon and silicon germanium (Si/SiGe) stacked structure. Annealing is performed afterwards to obtain the metal-semiconductor compounds, and CMP is performed thereafter to remove any metal layer outside of the vias, retaining the metal-semiconductor compounds at the source and drain and in the vias.

Note that in the embodiments discussed above, the metal-semiconductor compounds in the vias can include metal silicides, and the metal silicides in the vias and the metal silicide source/drain contacts can be the same kind or different kinds.

Specifically, the following process can be used to deposit a metal thin film on the inside walls of the vias:

depositing a first metal film on via bottoms and via walls to form a first metal thin film;

Removing portions of the first metal thin film deposited on via walls by wet etching;

depositing a second metal film on via walls;

wherein metal in the first metal film and metal in the second metal film can be the same kind or different kinds.

Thus, metal in the first metal film deposited on the via bottoms can diffuse into the source and drain and form metal silicides at the source and drain, while metal in the second metal film deposited on the via walls diffuses toward the silicon, silicon germanium (SiGe), or silicon and silicon germanium (Si/SiGe) stacked structures in the vias to form metal-semiconductor compounds in the vias. Metal in the first metal film and metal in the second metal film can be the same kind or different kinds. For example, platinum can be selected as the metal for the first metal film while platinum or other metal, such as nickel, cobalt, titanium, etc., can be used as the metal for the second metal film. Thus, a larger selection of metal can be used to form the metal-semiconductor compounds at the source and drain and in the vias, and a metal can be selected to form the metal-semiconductor compounds based on practical requirements to minimize the resistance of the metal-semiconductor compounds in the vias and the contact resistance between the source/drain metal silicide contacts and the metal-semiconductor compounds in the vias, allowing more flexible applications.

The methods in the above-described embodiments are divided into steps for ease of discussion. In practice, multiple steps can be combined into one step or a certain step can be further divided into multiple steps.

In yet another embodiment, as shown in FIG. 3E, a semiconductor device comprises at least one transistor, and an insulator layer 304 over the at least one transistor, the insulator layer having vias formed therein at positions corresponding to the source and drain of each transistor. The semiconductor device further comprises metal-semiconductor compounds 312 and 313 formed in the vias, and metal silicide contact regions 310 and 311 at the source and drain of each transistor, the metal silicide contact regions being formed concurrently with the metal-semiconductor compounds in the vias. The metal-semiconductor compounds in the vias are to lead out the source and drain of the transistor via the source/drain metal silicide contact regions.

In one embodiment, the metal-semiconductor compounds in the vias are formed by metal reacting with silicon, silicon germanium (SiGe), or a silicon and silicon germanium (Si/SiGe) stacked structure, the metal can be nickel, cobalt, titanium, platinum, tungsten, or a combination of one or more thereof, and silicon can be amorphous silicon or polysilicon. The metal-semiconductor compounds can include metal silicide, metal germanide, and/or metal germano-silicide.

Note that the metal-semiconductor compounds in the vias can include metal silicides, and the metal silicide at the source and drain and the metal silicide in the vias can be the same kind or different kinds.

We claim:

1. A method of making a semiconductor device, comprising:
   A. forming at least one transistor on a semiconductor substrate, each transistor having a source and a drain;
   B. forming an insulator layer covering the at least one transistor;
   C. etching the insulator layer to form vias at the source and drain of each transistor; and
   D. forming metal-silicide contact regions at the source and drain of each transistor, and forming metal-semiconductor compounds in the vias to lead out the source and drain;
   wherein steps B and C are performed before the metal-silicide contact regions are formed at the source and drain of each transistor;
   wherein the at least one transistor is formed on a semiconductor substrate and wherein step D comprises:
   D1-1. depositing a layer of silicon-containing semiconductor material over the insulator layer, the silicon-containing semiconductor material selected from the group consisting of silicon, silicon germanium (SiGe), and a silicon and silicon germanium Si/SiGe stacked structure, at least a portion of the silicon-containing semiconductor material is deposited in the vias;
   D1-2. depositing a layer of metal over the layer of silicon-containing semiconductor material; and
   D1-3. placing the substrate in a microwave heating chamber and performing annealing to cause metal-semiconductor compound to be formed at least in the vias, wherein multi-mode and multi-frequency microwaves are employed in the microwave heating chamber during annealing; and
   D1-4. removing any metal and metal-semiconductor compound outside of the vias by chemical mechanical polishing (CMP), while retaining metal-semiconductor compound formed in the vias; and
   wherein after step D1-1 and before step D1-2, the method further comprises removing any of the silicon-containing semiconductor material outside of the vias by chemical mechanical polishing (CMP).

2. The method of making a semiconductor device according to claim 1, wherein the metal-silicide contact regions at the source and drain of each transistor are formed concurrently with forming the metal-semiconductor compounds in the vias.

3. The method of making a semiconductor device according to claim 1, wherein the insulator layer is made of a low dielectric constant material.

4. The method of making a semiconductor device according to claim 3, wherein the insulator is made of silicon dioxide.

5. The method of making a semiconductor device according to claim 1, wherein the metal-semiconductor compounds are formed by metal reacting with the silicon-containing semiconductor material;
   wherein the metal is nickel, cobalt, titanium, platinum, tungsten or a combination of two or more thereof; and
   wherein the silicon is amorphous silicon or polysilicon.

* * * * *